(12) United States Patent
Dennison

(10) Patent No.: US 6,939,799 B2
(45) Date of Patent: Sep. 6, 2005

(54) METHOD OF FORMING A FIELD EFFECT TRANSISTOR AND METHODS OF FORMING INTEGRATED CIRCUITRY

(75) Inventor: Charles H. Dennison, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/132,784

(22) Filed: Apr. 24, 2002

(65) Prior Publication Data

US 2002/0117707 A1 Aug. 29, 2002

Related U.S. Application Data

(63) Continuation of application No. 09/730,335, filed on Dec. 4, 2000, which is a continuation of application No. 09/138,150, filed on Aug. 21, 1998, now abandoned.

(51) Int. Cl.[7] .......................................... H01L 21/4763
(52) U.S. Cl. ...................... 438/643; 438/642; 438/674; 438/685; 438/761; 438/653; 438/652
(58) Field of Search .............................. 438/643, 642, 438/674, 685, 761, 653, 652, 585, 588, 364, 369, 371; 257/751, 770

(56) References Cited

U.S. PATENT DOCUMENTS

| | | | |
|---|---|---|---|
| 4,847,111 A | 7/1989 | Chow et al. .................. | 427/38 |
| 4,884,123 A | 11/1989 | Dixit et al. | |
| 4,997,785 A | 3/1991 | Pfiester ........................ | 437/57 |
| 5,027,185 A | 6/1991 | Liauh .......................... | 357/59 |
| 5,083,190 A | 1/1992 | Pfiester ........................ | 357/42 |
| 5,164,333 A | 11/1992 | Schwalke et al. ........... | 437/200 |
| 5,244,835 A | 9/1993 | Hachiya ...................... | 437/186 |
| 5,282,972 A | 2/1994 | Hanna et al. ................ | 210/652 |
| 5,292,677 A | 3/1994 | Dennison ..................... | 437/52 |

(Continued)

FOREIGN PATENT DOCUMENTS

| | | |
|---|---|---|
| EP | 0 722 190 A2 | 12/1995 |
| EP | 0 588 176 A1 | 1/1996 |
| JP | 63012132 | 1/1988 |
| JP | 63012152 | 1/1988 |
| JP | 64-042857 | 2/1989 |
| JP | 64-072543 | 3/1989 |
| JP | 03-192768 | 8/1991 |
| JP | 06-204171 | 7/1994 |
| JP | 8017758 | 1/1996 |
| JP | 8279553 | 10/1996 |
| JP | 10093077 | 4/1998 |
| JP | 10-135460 | 5/1998 |
| KR | 97-0018661 | 4/1997 |

OTHER PUBLICATIONS

Semiconductor Instruments—Tech. Bull., Applied Materials Centura 5200 RTP (Dec., 2004) pp. 2–7.*

(Continued)

*Primary Examiner*—Eddie Lee
*Assistant Examiner*—Thomas Magee
(74) *Attorney, Agent, or Firm*—Wells St. John P.S.

(57) ABSTRACT

A method of forming integrated circuitry includes forming a field effect transistor gate over a substrate. The gate comprises polysilicon conductively doped with a conductivity enhancing impurity of a first type and a conductive diffusion barrier layer to diffusion of first or second type conductivity enhancing impurity received thereover. An insulative layer is formed over the gate. An opening is formed into the insulative layer to a conductive portion of the gate. Semiconductive material conductively doped with a conductivity enhancing impurity of a second type is formed within the opening in electrical connection with the conductive portion, with the conductive diffusion barrier layer of the gate being received between the semiconductive material of the gate and the semiconductive material within the opening. Other aspects are disclosed and claimed.

43 Claims, 2 Drawing Sheets

U.S. PATENT DOCUMENTS

| | | | |
|---|---|---|---|
| 5,304,504 A | | 4/1994 | Wei et al. ............... 437/44 |
| 5,312,768 A | | 5/1994 | Gonzalez ............... 437/40 |
| 5,318,924 A | * | 6/1994 | Lin et al. ............... 437/192 |
| 5,371,396 A | | 12/1994 | Vinal et al. ............... 257/412 |
| 5,418,398 A | | 5/1995 | Sardella et al. ............... 257/755 |
| 5,504,039 A | | 4/1996 | Grivna ............... 437/195 |
| 5,510,646 A | | 4/1996 | Forouhi et al. ............... 257/530 |
| 5,576,579 A | | 11/1996 | Agnello et al. ............... 257/751 |
| 5,589,415 A | | 12/1996 | Blanchard ............... 437/57 |
| 5,600,165 A | | 2/1997 | Tsukamoto et al. ............... 257/323 |
| 5,604,140 A | | 2/1997 | Byun ............... 437/41 |
| 5,633,200 A | | 5/1997 | Hu ............... 438/653 |
| 5,637,525 A | | 6/1997 | Dennison ............... 438/232 |
| 5,637,903 A | | 6/1997 | Liao et al. ............... 257/412 |
| 5,640,037 A | | 6/1997 | Blanchard ............... 257/369 |
| 5,641,708 A | | 6/1997 | Sardella et al. ............... 438/592 |
| 5,652,464 A | * | 7/1997 | Liao et al. ............... 257/751 |
| 5,668,037 A | | 9/1997 | Prall et al. ............... 438/238 |
| 5,710,454 A | | 1/1998 | Wu ............... 257/413 |
| 5,718,800 A | | 2/1998 | Juengling ............... 156/643.1 |
| 5,723,357 A | | 3/1998 | Huang ............... 437/57 |
| 5,753,528 A | | 5/1998 | Forouhi et al. ............... 437/60 |
| 5,770,496 A | | 6/1998 | Roberts ............... 438/238 |
| 5,776,823 A | | 7/1998 | Agnello et al. ............... 438/592 |
| 5,783,850 A | | 7/1998 | Liau et al. ............... 257/355 |
| 5,796,166 A | | 8/1998 | Agnello et al. ............... 257/751 |
| 5,818,092 A | | 10/1998 | Bai et al. ............... 257/388 |
| 5,821,140 A | | 10/1998 | Jost et al. ............... 438/241 |
| 5,828,130 A | | 10/1998 | Miller et al. ............... 257/754 |
| 5,856,237 A | | 1/1999 | Ku ............... 438/683 |
| 5,883,418 A | | 3/1999 | Kimura ............... 257/412 |
| 5,909,637 A | | 6/1999 | Charneski et al. ............... 438/687 |
| 5,910,021 A | | 6/1999 | Tabara ............... 438/636 |
| 5,923,999 A | | 7/1999 | Balasubramanyam et al. |
| 5,933,741 A | | 8/1999 | Tseng ............... 438/305 |
| 5,969,983 A | | 10/1999 | Thakur et al. ............... 365/149 |
| 6,001,726 A | | 12/1999 | Nagabushnam et al. ............... 438/618 |
| 6,075,262 A | | 6/2000 | Moriuchi et al. ............... 257/280 |
| 6,107,195 A | * | 8/2000 | Gittleman et al. ............... 438/653 |
| 6,107,656 A | | 8/2000 | Igarashi ............... 257/295 |
| 6,479,362 B2 | * | 11/2002 | Cunningham ............... 438/369 |

OTHER PUBLICATIONS

Stanley Wolf, "Silicon Processing for the VLSI Era: vol. 2," Lattice Press, Sunset Beach, CA. (1990) pp. 273–276.*

J. D. Hayden, F. K. Baker, S. A. Ernst, R. E. Jones, J. Klein, M. Lien, T. F. McNelly, T. C. Mele, H. Mendez, B–Y Nguyen, L. C. Parrillo, W. Paulson, J. R. Pfiester, F. Pintchovski, Y–C See, R. Sivan, B.M. Somero, and E.O. Travis, "A High Performance Half Micrometer Generation CMOS Technology for Fast SRAM's," IEEE Trans. on Electron Devices, vol. 38, No. 4, (1991) pp. 876–886.*

W–H. Chang, B. Davari, MR. Wordeman, Y. Taur, C. Hsu, and M. D. Rodriguez, " A High Performance 0.25–um CMOS Technology: Design and Characterization," IEEE Trans. on Electron Devices, vol. 39, No. 4, (1992), pp. 959–966.*

J. Nulman, B. Cohen, and K. Ngan, "Titanium Silicide and Titanium Nitride Layers Formed in an Integrated Multichamber System," Proc. VMIC Conference (1991), pp. 312–315.*

William C. O'Mara, Robert B. Herring, and Lee P. Hunt, "Handbook of Semiconductor Silicon Technology," Noyes Publ., Norwich, New York (1990), p. 684.*

* cited by examiner

METHOD OF FORMING A FIELD EFFECT TRANSISTOR AND METHODS OF FORMING INTEGRATED CIRCUITRY

CROSS REFERENCE TO RELATED APPLICATION

This application is a Continuation of U.S. patent application Ser. No. 09/730,335, which was filed on Dec. 4, 2000 and which is incorporated by reference herein. The Ser. No. 09/730,335 application was a continuation application of U.S. patent application Ser. No. 09/138,150, which was filed on Aug. 21, 1998, now abandoned and which is incorporated by reference herein.

TECHNICAL FIELD

This invention relates to field effect transistors, to integrated circuitry, to methods of forming field effect transistor gates, and to methods of forming integrated circuitry.

BACKGROUND OF THE INVENTION

One aspect of semiconductor wafer processing includes making buried contacts to field effect transistor gate lines. A conventional gate line typically comprises a gate dielectric layer and a conductively doped polysilicon layer (typically n+ doped) and an overlying silicide layer (i.e., $WSi_x$). These gates are typically fabricated by deposition or provision of these three layers over a semiconductor substrate, followed by collectively patterning these layers with photoresist to form the desired gate outlines. An insulative capping material might also be provided over the silicide layer prior to patterning to form the conductive portions of the gate line. Transistor gates might also be fabricated using damascene methods, and also above or below a thin film semiconductor layer such as in fabrication of semiconductor-on-insulator circuitry which might be top or bottom gated.

A thick insulating layer, such as borophosphosilicate glass, is typically provided over the resultant transistor and provided with an upper planar surface. Contact openings can then be etched through the insulating layer to the outer conductive portion of the transistor gates, as well as to other substrate areas. The openings are filled with conductive plugging material. Metal or conductively doped semiconductive material, such as polysilicon, are example materials.

In certain applications, it may be desirable that the conductive plugging material be a semiconductive material having opposite type conductivity enhancing dopant impurity as compared to the conductivity type impurity within the semiconductive material of the gate. For example where the gate is heavily doped to achieve conductivity with n-type material, in some applications it might be desirable to provide a conductively doped contact plug to that gate with p-type material. Unfortunately, the different dopant types can easily cross-diffuse relative to one another through the silicide which can lead to no conductive connection. One prior art solution to avoiding this diffusion is to initially line the contact opening with a very thin layer of an electrically conductive diffusion barrier material, such as TiN. Subsequently, the remaining portion of the opening is filled with conductively doped polysilicon to provide the desired electrical connection with the transistor gate.

BRIEF DESCRIPTION OF THE DRAWINGS

Preferred embodiments of the invention are described below with reference to the following accompanying drawings.

SUMMARY OF INVENTION

The invention includes field effect transistors, integrated circuitry, methods of forming field effect transistor gates, and methods of forming integrated circuitry. In one implementation, a field effect transistor includes a pair of source/drain regions having a channel region positioned therebetween. A gate is positioned operatively proximate the channel region, and includes conductively doped-semiconductive material, a silicide layer and a conductive diffusion barrier layer.

In another implementation, integrated circuitry comprises a field effect transistor having a gate, a gate dielectric layer, source/drain regions and a channel region. The gate comprises semiconductive material conductively doped with a conductivity enhancing impurity of a first type and a conductive diffusion barrier layer. Insulative material is provided proximate the gate, and includes semiconductive material therein which is in electrical connection with the gate. Such semiconductive material is conductively doped with a conductivity enhancing impurity of a second type. The conductive diffusion barrier layer of the gate is provided between the gate semiconductive material and the semiconductive material provided within the insulative material.

A method of forming a field effect transistor gate includes forming a layer of conductively doped semiconductive material over a substrate, forming a layer of a conductive silicide over the substrate, and forming a conductive diffusion barrier layer over the substrate. Portions of the semiconductive material layer, the silicide layer and the conductive diffusion barrier layer are removed to form a transistor gate comprising the semiconductive material, the conductive silicide and the conductive diffusion barrier layer.

Other aspects are disclosed and claimed.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
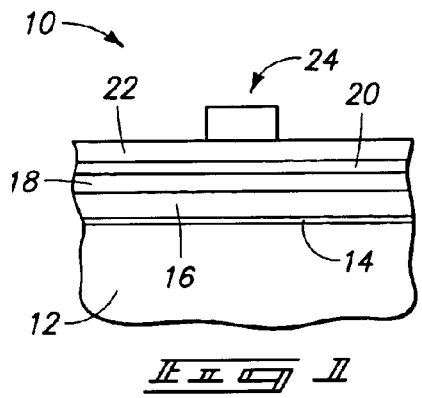
FIG. 1 is a diagrammatic sectional view of a semiconductor wafer fragment at one processing step in accordance with the invention.

The discussion initially proceeds with reference to a preferred embodiment of FIGS. 1–4. Referring to FIG. 1, a semiconductor wafer fragment 10 in one embodiment comprises a bulk monocrystalline silicon substrate 12. A gate dielectric layer 14 (i.e., thermally grown silicon dioxide having a thickness of from 50 to 90 Angstroms) is formed over substrate 12. A layer 16 of conductively doped semiconductive material If is formed over substrate 12 and gate dielectric layer 14, such as by chemical vapor deposition of polysilicon wherein the dopant is provided in situ. An example dopant is any suitable n-type dopant deposited to an example concentration of at least $5 \times 10^{20}$ atoms/cm$^3$. A layer 18 of a conductive silicide is formed over the substrate and doped semiconductive material layer 16. Example preferred materials are refractory metal silicides, such as WSi$_x$ and TiSi$_x$. Such can be formed by chemical vapor deposition, refractory metal layer deposition followed by a silicidation anneal, or other manner. A preferred thickness for layer 18 is from 800 to 1400 Angstroms.

A conductive diffusion barrier layer 20 is formed over the substrate and, in this example, over silicide layer 18. Example materials include titanium compounds and tungsten compounds. Preferred example materials are TiN, TiO$_x$N$_y$, W$_x$N$_y$ and TiW$_x$N$_y$, for example deposited by chemical vapor deposition to a thickness of from 100 to 300 Angstroms. Accordingly in this embodiment, the conductive diffusion barrier layer is provided over both silicide layer 18 and doped semiconductive material layer 16, and in contact with silicide layer 18. Further, conductive diffusion barrier layer 20 is not in contact with semiconductive material layer 16.

An insulative capping layer 22 is preferably formed over the conductive gate materials, with an example being SiO$_2$ or Si$_3$N$_4$ deposited to a thickness of from 1,500 to 2,500 Angstroms. A masking layer, such as deposited photoresist, is formed over the underlying layers and selectively exposed to light and developed, forming a photoresist mask 24 in the shape of a desired transistor gate line.

Figure 2:
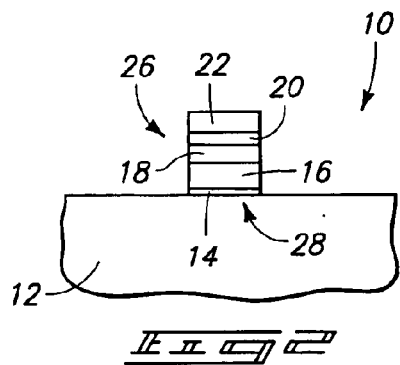
FIG. 2 is a view of the FIG. 1 wafer at a processing step subsequent to that shown by FIG. 1.

Referring to FIG. 2, portions of semiconductive material layer 16, silicide layer 18, conductive diffusion barrier layer 20 and insulating layer 22 have been removed to form a transistor gate 26 comprising the above-described conductive materials. Such removal is preferably by so etching away unmasked portions by conventional etching techniques, thereby forming a transistor gate initially beneath masking layer 24. Such is shown as having been removed in FIG. 2. Gate 26 defines or is positioned over and operatively proximate a channel region 28, here formed within bulk semiconductor substrate 12.

Figure 3:
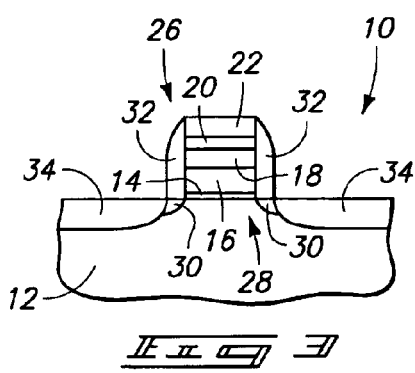
FIG. 3 is a view of the FIG. 1 wafer at a processing step subsequent to that shown by FIG. 2.

Referring to FIG. 3, lightly doped drain regions 30 are formed within bulk substrate 12 laterally outward of gate 26, followed by deposition and anisotropic etching of an insulative material to form spacers 32. A pair of source/drain regions are formed within substrate 12, with channel region 28 accordingly being positioned therebetween.

Figure 4:
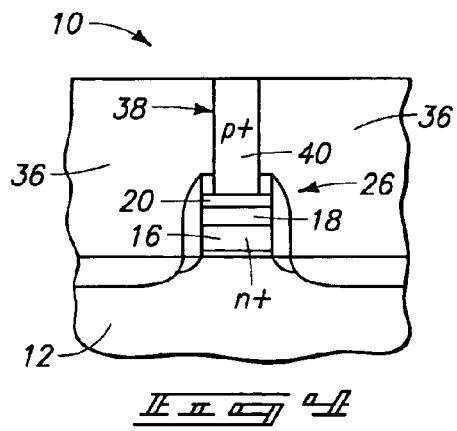
FIG. 4 is a view of the FIG. 1 wafer at a processing step subsequent to that depicted by FIG. 3.

Referring to FIG. 4, an insulative layer 36 is formed over the substrate, with an example being borophosphosilicate glass (BPSG) deposited to a thickness of 10,000 Angstroms. Such provides but one example of providing insulative material which is received proximate gate 26. Layer 36 is preferably planarized, as shown. An opening 38 is formed into insulative layer 36, and all the way to a conductive portion of gate 26, as shown. Semiconductive material conductively doped with a conductivity enhancing impurity opposite in type to that used to dope material 16 is formed within the opening. A preferred technique is chemical vapor deposition with in situ doping, followed by planarization such as chemical-mechanical polishing to produce the illustrated plug 40 of semiconductive material within opening 38. Such provides but one example of providing conductively doped semiconductive material within electrically insulative material 36, which is proximate gate 36, and in electrical connection with gate 36. Conductive diffusion barrier layer 20 of gate 26 is accordingly received between or intermediate semiconductive material 16 of gate 26 and semiconductive material 40 within opening 38. FIG. 4 illustrates plugging material 40 as comprising p+ doped material, with the semiconductive polysilicon material of layer 16 being n+ doped. Such could of course be reversed. Alternately, the conductivity types could be the same. Further considered, silicide layer 18 might not be included in certain aspects of the invention, which is intended only to be limited by the accompanying claims appropriately interpreted in accordance with the Doctrine of Equivalents. Where a silicide layer is utilized, preferably the silicide layer and conductive diffusion barrier layer comprise a common metal. For example where the silicide is WSi$_x$, a preferred barrier layer material is one or more of W$_x$N$_y$ and TiW$_x$N$_y$. Where the silicide layer is TiSi$_x$, a preferred barrier layer material is one or more of TiN, TiO$_x$N$_y$, and TiW$_x$N$_y$. The barrier layer and silicide layer are preferably deposited in the same chamber.

Figure 5:
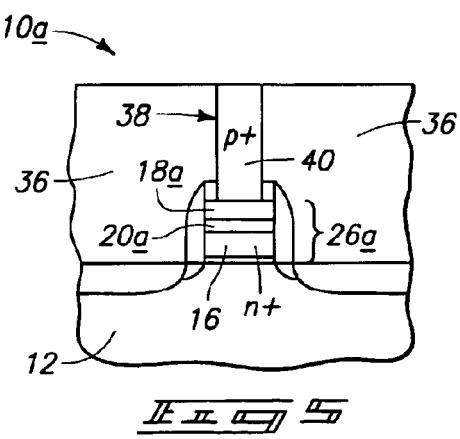
FIG. 5 is a diagrammatic sectional view of an alternate embodiment semiconductor wafer fragment to that depicted by FIG. 4.

The above-described first embodiment provides a construction whereby semiconductive material 40 within insulating material 36 contacts conductive diffusion barrier layer 20 of gate 26, but not silicide layer 18. Further, conductive diffusion barrier layer 20 is in contact with silicide layer 18 and not semiconductive material layer 16. Yet, conductive diffusion barrier layer 20 is received over both silicide layer 18 and semiconductive material layer 16. FIG. 5 illustrates but one embodiment alternate to that of FIG. 4. Like numerals from the first-described embodiment are utilized where appropriate, with differences being indicated by the suffix "a" or with different numerals. Here, conductive diffusion barrier layer 20a is provided immediately over and in contact with semiconductive material 16, and silicide layer 18a is provided immediately over barrier layer 20a. Accordingly, conductive diffusion barrier layer 20a is in contact with both semiconductive material 16 and silicide layer 18a. Further, silicide layer 18a is received over conductive diffusion barrier layer 20a. Further, semiconductive material 40 within insulative material 36 does not contact conductive diffusion barrier layer 20a of gate 26a, but does contact silicide layer 18a. In both above-described embodiments, opening 38 within insulating material 36 is most preferably substantially or essentially void of any conductive diffusion barrier layer material, thus potentially simplifying processing for example over that disclosed above as prior art.

The above-described embodiments depict exemplary implementations associated with bulk substrate processing. Processing is also contemplated in accordance with the invention with semiconductor-on-insulator layers or other layers, and with the gates and contact plugging semiconductive material being received variously or beneath such semiconductor-on-insulator layers.

Figure 6:
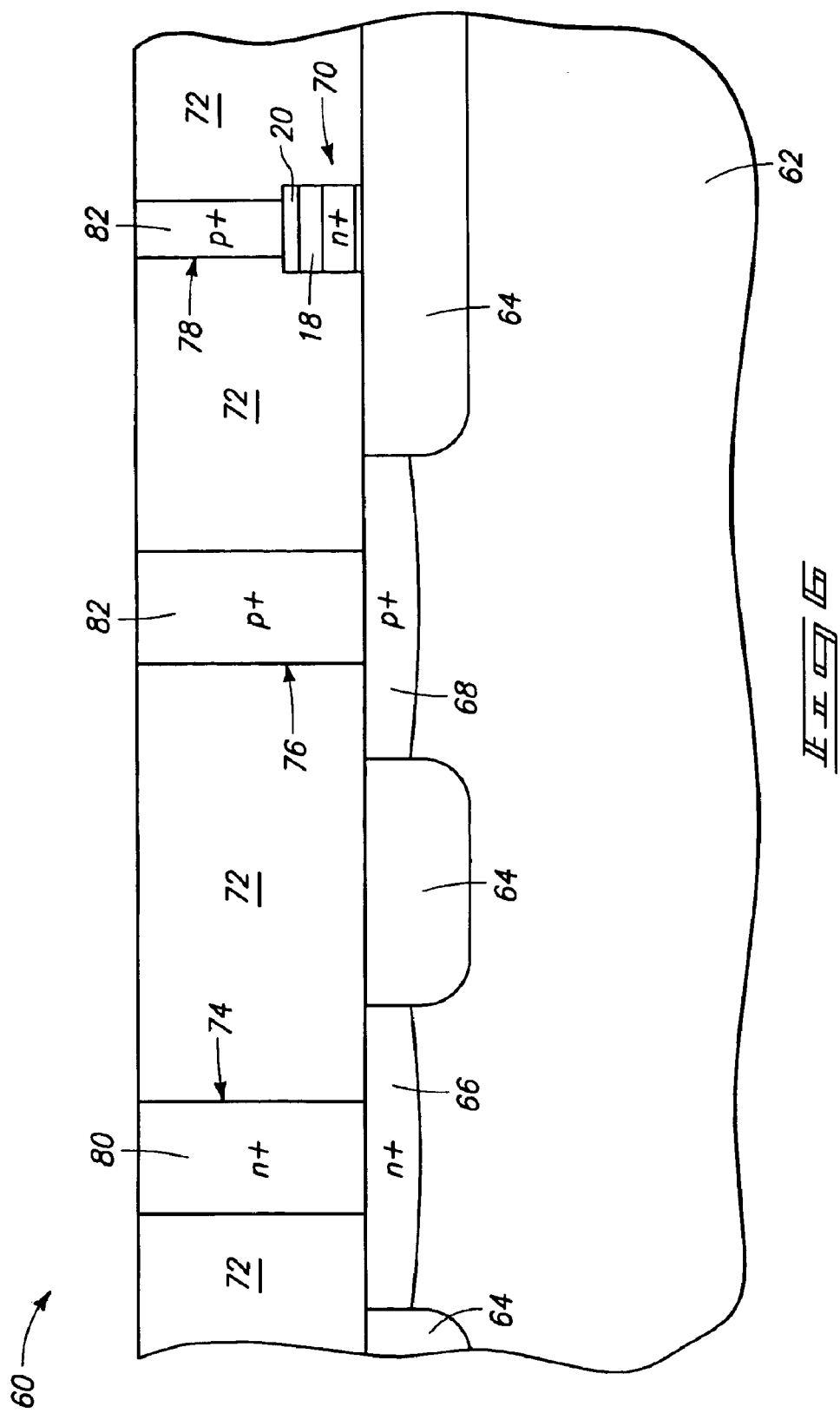
FIG. 6 is a diagrammatic sectional view of another alternate embodiment semiconductor wafer fragment in accordance with the invention.

FIG. 6 illustrates a further exemplary implementation of the invention. A semiconductor wafer fragment 60 comprises a bulk monocrystalline silicon substrate 62 having shallow trench oxide isolation regions 64 formed therein. An n+ diffusion region 66 and a p+ diffusion region 68 are formed intermediate pairs of isolation regions 64, as shown. A gate construction 70, such as a gate 26 in the above-described first embodiment, is shown provided over the far-right illustrated isolation region 64. A planarized insulating layer 72 is formed over the substrate, and includes a plurality of contact openings 74, 76, and 78 formed therein to diffusion region 66, diffusion region 68, and gate 70, respectively. Opening 74 is plugged with n+ conductively doped semiconductive material 80 for making electrical connection with n+ diffusion region 66. Openings 76 and 78 are plugged with p+ conductively doped semiconductive material 82.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a field effect transistor gate over a substrate, comprising:
    forming over the substrate a layer comprising polysilicon conductively doped with at least one of a p-type or n-type conductivity enhancing impurity effective to render the polysilicon conductive;
    forming a layer of a conductive silicide over the substrate;
    forming a conductive diffusion barrier layer to restrict diffusion of p-type or n-type conductivity enhancing impurity over the substrate, the conductive diffusion barrier layer comprising at least two of $W_xN_y$, $TiO_xN_y$ and $TiW_xN_y$; and
    removing portions of the polysilicon layer, the silicide layer and the conductive diffusion barrier layer to form a transistor gate comprising the polysilicon, the conductive silicide and the conductive diffusion barrier layer.

2. A method of forming integrated circuitry comprising:
    forming a field effect transistor gate over a substrate, the gate comprising polysilicon conductively doped with a conductivity enhancing impurity of a first type and a conductive diffusion barrier layer to diffusion of first or second type conductivity enhancing impurity, the conductive diffusion barrier layer comprising at least two of $W_xN_y$, $TiO_xN_y$ and $TiW_xN_y$;
    forming an insulative layer over the substrate;
    forming an opening into the insulative layer;
    forming semiconductive material conductively doped with a conductivity enhancing impurity of a second type within the opening; and
    providing the doped semiconductive material within the opening in electrical connection with the gate, with the conductive diffusion barrier layer of the gate being received between the polysilicon of the gate and the semiconductive material within the opening.

3. The method of claim 3 wherein the first type is n and the second type is p.

4. The method of claim 2 wherein the first type is p and the second type is n.

5. The method of claim 2 comprising forming the gate to also comprise a conductive silicide.

6. The transistor of claim 5 wherein the silicide and the conductive diffusion barrier comprise the same metal.

7. The method of claim 2 comprising forming the semiconductive material within the opening to contact the conductive diffusion barrier layer of the gate.

8. The method of claim 2 wherein the semiconductive material formed within the opening does not contact the conductive diffusion barrier layer of the gate.

9. The method of claim 2 comprising forming the gate to also comprises a conductive silicide, the semiconductive material within the opening contacting the silicide.

10. The method of claim 2 wherein the opening is filled with conductive material none of which comprises any conductive diffusion barrier layer material.

11. A method of forming integrated circuitry comprising:
    forming a field effect transistor gate over a substrate, the gate comprising polysilicon conductively doped with a conductivity enhancing impurity of a first type and a conductive diffusion barrier layer to diffusion of first or second type conductivity enhancing impurity received there over, the conductive diffusion barrier layer comprising at least two of $W_xN_y$, $TiO_xN_y$ and $TiW_xN_y$;
    forming an insulative layer over the gate;
    forming an opening into the insulative layer to a conductive portion of the gate; and
    forming semiconductive material conductively doped with a conductivity enhancing impurity of a second type within the opening in electrical connection with the conductive portion, with the conductive diffusion barrier layer of the gate being received between the polysilicon of the gate and the semiconductive material within the opening.

12. The method of claim 11 wherein the first type is n and the second type is p.

13. The method of claim 11 wherein the first type is p and the second type is n.

14. The method of claim 11 comprising forming the gate to also comprise a conductive silicide.

15. The method of claim 11 comprising forming the semiconductive material within the opening to contact the conductive diffusion barrier layer of the gate.

16. The method of claim 11 wherein the semiconductive material formed within the opening does not contact the conductive diffusion barrier layer of the gate.

17. The method of claim 11 comprising forming the gate to also comprises a conductive silicide, the semiconductive material within the opening contacting the silicide.

18. The method of claim 11 wherein the opening is filled with conductive material none of which comprises any conductive diffusion barrier layer material.

19. The method of claim 1 wherein the conductive diffusion barrier layer comprises $TiO_xN_y$ as one of the at least two of $W_xN_y$, $TiO_xN_y$ and $TiW_xN_y$.

20. The method of claim 1 wherein the conductive diffusion barrier layer comprises $W_xN_y$ as one of the at least two of $W_xN_y$, $TiO_xN_y$ and $TiW_xN_y$.

21. The method of claim 1 wherein the conductive diffusion barrier layer is formed over the silicide layer.

22. The method of claim 5 wherein the silicide layer is formed over the conductive diffusion barrier layer.

23. The method of claim 1 wherein the conductive diffusion barrier layer comprises $TiW_xN_y$ as one of the at least two of $W_xN_y$, $TiO_xN_y$ and $TiW_xN_y$.

24. The method of claim 1 wherein the conductive diffusion barrier layer comprises $TiW_xN_y$ and $TiO_xN_y$.

25. The method of claim 1 the wherein conductive diffusion barrier layer comprises $TiW_xn_y$ and $W_xN_y$.

26. The method of claim 1 the wherein conductive diffusion barrier layer comprises $W_xN_y$ and $TiO_xN_y$.

27. The method of claim 2 wherein the conductive diffusion barrier layer comprises $W_xN_y$ as one of the at least two of $W_xN_y$, $TiO_xN_y$, and $TiW_xN_y$.

28. The method of claim 2 wherein the conductive diffusion barrier layer comprises $TiO_xN_y$ as one of the at least two of $W_xN_y$, $TiO_xN_y$ and $TiW_xN_y$.

29. The method of claim 2 wherein the conductive diffusion barrier layer comprises $TiW_xN_y$ as one of the at least two of $W_xN_y$, $TiO_xN_y$ and $TiW_xN_y$.

30. The method of claim 2 wherein the conductive diffusion barrier layer comprises $TiW_xn_y$ and $TiO_xN_y$.

31. The method of claim 2 the wherein conductive diffusion barrier layer comprises $TiW_xn_y$ and $W_xN_y$.

32. The method of claim 2 the wherein conductive diffusion barrier layer comprises $W_xN_y$ and $TiO_xN_y$.

33. The method of claim 11 wherein the conductive diffusion barrier layer comprises $W_xN_y$ as one of the at least two of $W_xN_y$, $TiO_xN_y$, and $TiW_xN_y$.

34. The method of claim 11 wherein the conductive diffusion barrier layer comprises $TiO_xN_y$ as one of the at least two of $W_xN_y$, $TiO_xN_y$, and $TiW_xN_y$.

35. The method of claim 11 wherein the conductive diffusion barrier layer comprises $TiW_xN_y$ as one of the at least two of $W_xN_y$, $TiO_xN_y$, and $TiW_xN_y$.

36. The method of claim 11 wherein the conductive diffusion barrier layer comprises $TiW_xN_y$ and $TiO_xN_y$.

37. The method of claim 11 the wherein conductive diffusion barrier layer comprises $TiW_xN_y$ and $W_xN_y$.

38. The method of claim 11 the wherein conductive diffusion barrier layer comprises $W_xN_y$ and $TiO_xN_y$.

39. The method of claim 1 wherein the conductive diffusion barrier layer comprises $W_xN_y$, $TiW_xN_y$, and $TiO_xN_y$.

40. The method of claim 2 wherein the conductive diffusion barrier layer comprises $W_xN_y$, $TiW_xN_y$, and $TiO_xN_y$.

41. The method of claim 11 wherein the conductive diffusion barrier layer comprises $W_xN_y$, $TiW_xN_y$, and $TiO_xN_y$.

42. The method of claim 1 wherein the conductivity enhancing impurity is n-type, and at a concentration of at least $5 \times 10^{20}$ atmos/cm$^3$.

43. The method of claim 1 wherein the layer of conductive silicide is formed to a thickness of from 800 Angstroms to 1400 Angstroms.

* * * * *

UNITED STATES PATENT AND TRADEMARK OFFICE
CERTIFICATE OF CORRECTION

| | |
|---|---|
| PATENT NO. | : 6,939,799 B2 |
| APPLICATION NO. | : 10/132784 |
| DATED | : September 6, 2005 |
| INVENTOR(S) | : Dennision |

It is certified that error appears in the above-identified patent and that said Letters Patent is hereby corrected as shown below:

Title Page 1, in line 1 of the title, please delete "METHOD" before "OF FORMING" and insert --METHODS--.

Title Page 1, in line 2 of the title, please delete insert --GATES-- after "TRANSISTOR".

Title Page 2, col. 1, please insert --5,696,017 * 12/1997 Ueno et al..........437/60-- before "5,710,454".

Title Page 2, col. 2, please insert --6,211,034 4/2001 Visokay et al..........438/395-- before "6,479,362".

Title Page 2, col. 2, please insert --6,537,909 * 3/2003 Wan-Jeng et al.........438/653-- after "Cunningham........438/369".

Col. 2, line 66, please delete "If" after "material".

Col. 3, line 35, please delete "so" after "by".

Col. 5, line 48, claim 3, please delete "3" after "claim" and insert --2--.

Col. 5, line 55, claim 6, please insert --layer-- after "barrier".

Col. 5, line 63, claim 9, please delete "comprises" after "also" and insert --comprise--.

Col. 6, line 31, claim 17, please delete "comprises" after "also" and isnert --comprise--.

Col. 6, line 51, claim 25, please delete "the wherein" after "claim 1" and insert --wherein the--.

UNITED STATES PATENT AND TRADEMARK OFFICE
CERTIFICATE OF CORRECTION

PATENT NO. : 6,939,799 B2
APPLICATION NO. : 10/132784
DATED : September 6, 2005
INVENTOR(S) : Dennision It is certified that error appears in the above-identified patent and that said Letters Patent is hereby corrected as shown below:

Col. 6, line 53, claim 26, please delete "the wherein" after "claim 1" and insert --wherein the--.

Col. 6, line 65, claim 30, please delete "$TiW_xn_y$" after "comprises" and insert -- $TiW_xN_y$--.

Col. 6, line 66, claim 31, please delete "the wherein" after "claim 1" and insert --wherein the--.

Col. 6, line 66, claim 30, please delete "$TiW_xn_y$" after "comprises" and insert -- $TiW_xN_y$--.

Col. 7, line 1, claim 32, please delete "the wherein" after "claim 2" and insert --wherein the--.

Col. 7, line 14, claim 37, please delete "the wherein" after "claim 11" and insert --wherein the--.

Col. 7, line 16, claim 38, please delete "the wherein" after "claim 11" and insert --wherein the--.

Col. 8, line 12, claim 42, please delete "$atmos/cm^3$" after "$5 \times 10^{20}$" and insert --$atoms/cm^3$--.

Signed and Sealed this

Eighteenth Day of July, 2006

JON W. DUDAS
*Director of the United States Patent and Trademark Office*